United States Patent
Suzuki (10) Patent No.: US 9,576,877 B2
(45) Date of Patent: Feb. 21, 2017

(54) ELECTRONIC COMPONENT, ELECTRONIC DEVICE, METHOD OF MANUFACTURING MOUNTED MEMBER, AND METHOD OF MANUFACTURING ELECTRONIC COMPONENT

(71) Applicant: CANON KABUSHIKI KAISHA, Tokyo (JP)

(72) Inventor: Takanori Suzuki, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 36 days.

(21) Appl. No.: 14/520,211

(22) Filed: Oct. 21, 2014

(65) Prior Publication Data

US 2015/0116975 A1   Apr. 30, 2015

(30) Foreign Application Priority Data

Oct. 25, 2013  (JP) ................. 2013-222522

(51) Int. Cl.
H05K 7/02 (2006.01)
H05K 7/04 (2006.01)
H01L 23/36 (2006.01)
H01L 23/055 (2006.01)

(52) U.S. Cl.
CPC ............. *H01L 23/36* (2013.01); *H01L 23/055* (2013.01); *H01L 2224/05554* (2013.01); *H01L 2224/48091* (2013.01); *H01L 2224/48227* (2013.01); *H01L 2224/49171* (2013.01); *Y10T 29/49002* (2015.01)

(58) Field of Classification Search
USPC ........ 361/760, 748, 807, 809, 810, 723, 764, 361/770, 804
See application file for complete search history.

(56) References Cited

U.S. PATENT DOCUMENTS

| | | | | |
|---|---|---|---|---|
| 5,748,448 A | * | 5/1998 | Hokari | H04N 5/2253 174/541 |
| 2007/0200053 A1 | * | 8/2007 | Nomura | H01L 27/14618 250/206 |
| 2012/0147539 A1 | * | 6/2012 | Tsujino | H01L 23/057 361/679.01 |

FOREIGN PATENT DOCUMENTS

| | | | | |
|---|---|---|---|---|
| JP | 2007-208045 A | | 8/2007 | |
| JP | 2011-44695 A | | 3/2011 | |
| JP | 2011-96827 A | | 5/2011 | |
| JP | 2013-89739 A | | 5/2013 | |
| JP | 2013-93494 A | | 5/2013 | |
| JP | 5361663 B2 | | 12/2013 | |
| JP | P2015-103619 A | * | 6/2015 | ............. H01L 23/02 |

* cited by examiner

*Primary Examiner* — Hung S Bui
(74) *Attorney, Agent, or Firm* — Canon U.S.A., Inc. IP Division (57) ABSTRACT

A frame member includes a first portion, a second portion, and a third portion located between the first portion and the second portion, and wherein the lengths of the first portion and the second portion in a circumferential direction are longer than the length of the third portion in the circumferential direction, and a Young's modulus of the third portion is lower than the Young's moduli of the first portion and the second portion.

20 Claims, 8 Drawing Sheets

FIG. 5C

ELECTRONIC COMPONENT, ELECTRONIC DEVICE, METHOD OF MANUFACTURING MOUNTED MEMBER, AND METHOD OF MANUFACTURING ELECTRONIC COMPONENT

BACKGROUND OF THE INVENTION

Field of the Invention

This disclosure relates to a technology of mounting electronic devices.

Description of the Related Art

Japanese Patent Laid-Open No. 2007-208045 discloses an image pickup device including a wiring substrate, a frame member arranged on the wiring substrate, an image pickup element arranged on the wiring substrate inside the frame member, and a transparent cover arranged on the frame member.

In Japanese Patent Laid-Open No. 2007-208045, reliability of the image pickup device is enhanced by increasing rigidity of the frame member. However, when employing a large-sized image pickup element (electronic device), an increase in size of the frame member is required for maintaining the rigidity of the frame member. Therefore, the image pickup device (electronic component) is increased in size correspondingly. Accordingly, a technology of securing reliability while restraining the increase in size of the electronic component even though the electronic device is increased in size.

SUMMARY OF THE INVENTION

A first aspect of this disclosure is an electronic component including: a base body having a first area and a second area in a periphery of the first area; an electronic device fixed to the first area of the base body; a lid member opposing the electronic device via a space; and a frame member configured to surround the space and fixed to the second area of the base body, wherein the frame member includes a first portion, a second portion, and a third portion located between the first portion and the second portion along a circumferential direction of the frame member, and wherein the lengths of the first portion and the second portion in the circumferential direction are longer than the length of the third portion in the circumferential direction, coefficients of linear expansion of the first portion and the second portion are different from a coefficient of linear expansion of at least one of the base body and the lid member, and a Young's modulus of the third portion is lower than Young's moduli of the first portion and the second portion.

Further features of the present invention will become apparent from the following description of exemplary embodiments with reference to the attached drawings.

BRIEF DESCRIPTION OF THE DRAWINGS

FIGS. 3A-1, 3A-2, 3B-1, 3B-2, 3C-1, 3C-2, 3D-1 and 3D-2 are schematic plan views and schematic cross-sectional views illustrating an example of a method of manufacturing the electronic component.

DESCRIPTION OF THE EMBODIMENTS

Modes for implementing this disclosure will be described with reference to the drawings. In the description and the drawings described below, common components across a plurality of the drawings are denoted by the same reference signs. Therefore, common configurations will be described with reference to the plurality of drawings, and description of the configurations denoted by the common signs may be omitted as needed.

First Embodiment

Figure 1A:
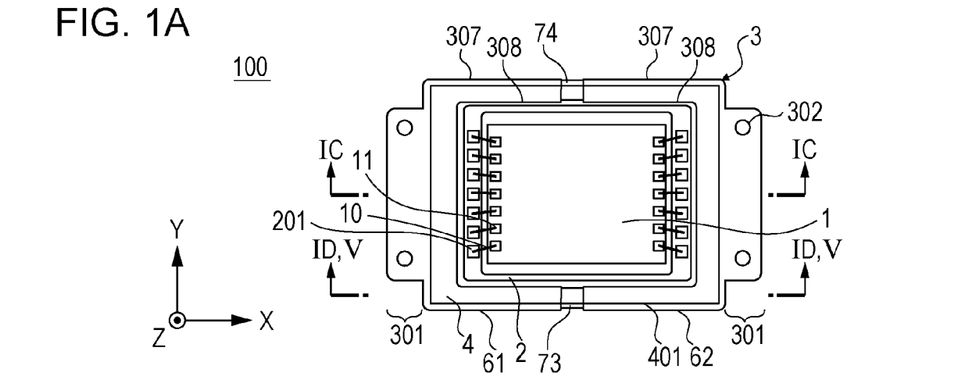
FIGS. 1A to 1D are schematic plan views and schematic cross-sectional views illustrating an example of an electronic component.
Figure 1B:
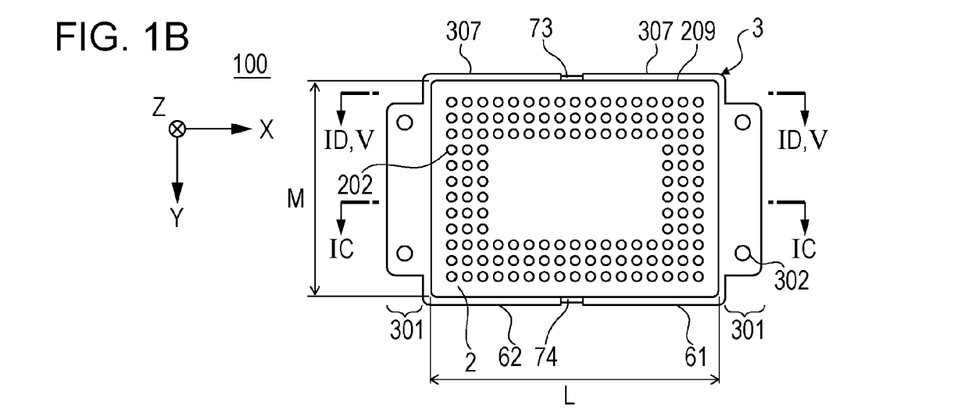
Figure 1C:
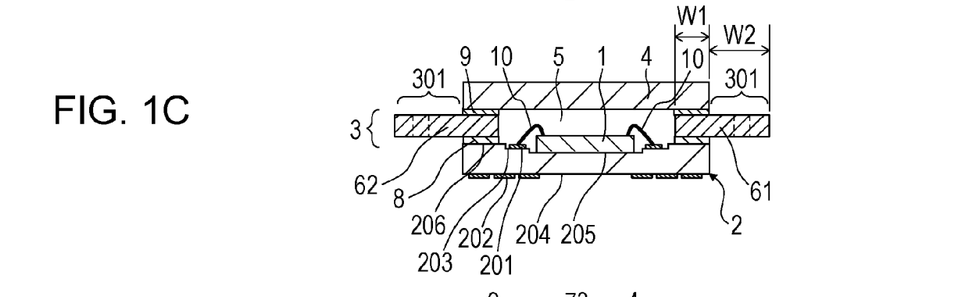
Figure 1D:
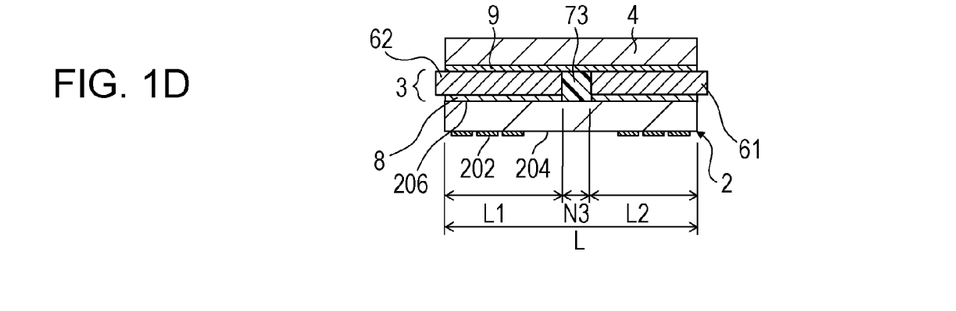

An example of an electronic component 100 will be described as a first embodiment. FIG. 1A is a schematic plan view of the electronic component 100 when viewed from the front, and FIG. 1B is a schematic plan view of the electronic component 100 when viewed from the back. FIG. 1C is a cross sectional view of the electronic component 100 taken along a line IC-IC illustrated in FIGS. 1A and 1B. FIG. 1D is a cross sectional view of the electronic component 100 taken along a line ID-ID illustrated in FIGS. 1A and 1B.

An electronic device 1 and the electronic component 100 have a rectangular shape in an X-direction and a Y-direction. In the drawings, the X-direction, the Y-direction, and a Z-direction are illustrated. The X-direction corresponds to a long side direction of the electronic component, the Y-direction corresponds to a short side direction of the electronic component, and the Z-direction corresponds to a thickness direction of the electronic component. The line IC-IC and the line ID-ID extend respectively in the X-direction, and are different in position in the Y-direction.

The electronic component 100 mainly includes an electronic device 1, a base body 2, a frame member 3, and a lid member 4. The base body 2, the frame member 3, and the lid member 4 function as a container (package) configured to accommodate the electronic device 1. Specifically, the base body 2 and the frame member 3 function as mounted members on which the electronic device 1 is to be mounted.

The type of the electronic device 1 is not specifically limited, but typically is an optical device. For example, image pickup devices such as a CCD image sensor and a CMOS image sensor, and display devices such as an EL display are included. Electrodes 11 (electrode pad) for performing communication between the electronic device 1 and the outside are provided in a peripheral edge area of the electronic device 1. If the electronic device 1 is an image pickup device, the electronic component 100 is an image pickup device, and if the electronic device 1 is a display device, the electronic component 100 is a display apparatus.

The electronic device 1 is fixedly mounted on the base body 2 in a center area 205 (first area) thereof via a fixing member (not illustrated) such as a general die bond material. The center area 205 may be referred to as a mounted area. The frame member 3 is fixed to a peripheral area 206 (second area) of the base body 2 via a fixing member 8. The lid member 4 is fixed to the frame member 3 via a fixing member 9. The lid member 4 opposes the electronic device 1 via an internal space 5. The frame member 3 surrounds a space located at an orthogonal projection of the center area 205. In this example, the frame member 3 surrounds the internal space 5 between the lid member 4 and the electronic device 1. The frame member 3 may or may not surround the electronic device 1. The fact that the frame member 3 surrounds the internal space 5 and the electronic device 1 means that the frame member 3 faces the internal space 5 and an electronic device 10 over 90% the length of an entire circumference of an inner edge 308 of the frame member 3. Therefore, in the case where the frame member 3 surrounds the electronic device 1, 90% the entire circumference of a side surface of the electronic device 1 faces the inner edge 308 of the frame member 3 in an X-Y direction. In this manner, the electronic device 1 is protected from an external space by the container composed of the base body 2, the frame member 3, and the lid member 4. Although detailed description will be given later, the frame member 3 includes high rigidity portions (two portions, namely, a first portion 61 and a second portion 62 in FIGS. 1A to 1D), and low rigidity portions (two portions, namely, a third portion 73 and a fourth portion 74 in FIGS. 1A to 1D).

In the example of FIG. 1A to 1D, in the X-direction and the Y-direction, an outer edge of the electronic component 100 is defined mainly by an outer edge 209 of the base body 2, an outer edge 307 of the frame member 3, and an outer edge 401 of the lid member 4. The frame member 3 includes the inner edge 308 in addition to the outer edge 307.

The container composed of the base body 2, the frame member 3, and the lid member 4 includes internal terminals 201 facing the internal space 5 and external terminals 202 facing the external space. The internal terminals 201 and the external terminals 202 are provided on a surface of the base body 2. Here, a plurality of the internal terminals 201 are provided in two rows along the Y-direction. A plurality of the external terminals 202 are arranged in a matrix pattern along the X-direction and the Y-direction on the back side of the electronic component 100. However, the internal terminals 201 and the external terminals 202 are not limited to this shape, and may be arranged in an arbitrary shape.

The internal terminals 201 and the external terminals 202 are electrically connected via an embedded portion, which is not illustrated, embedded as an internal wiring in an interior of the base body 2. The electrodes 11 of the electronic device 1, which constitute part of the electronic component 100, and the internal terminals 201 of the container are electrically connected via the connecting conductor 10. In this example, each connection between the electrode 11 and the internal electrode 201 is achieved by wire bonding connection, and the connecting conductor 10 is a metallic wire (bonding wire). However, the connection between the electrode 11 and the internal terminal 201 may be achieved by a flip chip connection. The external terminals 202 in this example are LGA (Land Grid Array). However, PGA (Pin Grid Array), BGA (Ball Grid Array), and LCC (Leadless Chip Carrier) are also applicable. In such a mode, the plurality of external terminals 202 may be located in an orthogonally-projected area from the lid member 4 to the base body 2. Part of the plurality of external terminals 202 is located in an orthogonally-projected area from the electronic device 1 to the base body 2. The internal terminals 201, the embedded portion, and the external terminals 202 may be integrated by using a lead frame. In the mode using the lead frame, the plurality of external terminals 202 are located out of the orthogonally-projected area from the lid member 4 to the base body 2.

The electronic component 100 is electrically connected to connecting terminals of wiring members such as a print-wiring board via the external terminals 202 and, simultaneously, is fixed to the wiring members. The external terminals 202 located in the orthogonally-projected area from the lid member 4 to the base body 2 may be electrically connected to an external circuit by reflow soldering using solder paste. In this manner, the electronic component 100 is secondarily mounted on the wiring member, and constitutes part of an electronic module. The electronic device provided with the electronic component 100 and a housing configured to accommodate the electronic component 100 is formed by integrating the electronic module with the housing. The electronic device is an information terminal having an image pickup system such as a camera, a display system such as a TV, an image-pickup function, and a display function.

The peripheral area 206 of the base body 2 is located in a periphery of the center area 205, that is, between the center area 205 and the outer edge 209. The base body 2 of this example is exemplified as a configuration in which a shoulder is provided between a surface where the center area 205 is located and a surface where the internal terminals 201 are located. The base body 2 of this example is exemplified as a configuration in which a shoulder is provided between the surface where the internal terminals 201 are located and a surface where the peripheral area 206 is located. The surface where the internal terminals 201 are provided defined as an internal terminal surface 203, the surface where the external terminals 202 are provided is defined as an external terminal surface 204, and a surface to be adhered to the frame member 3 is defined as the peripheral area 206. The internal terminal surface 203, the center area 205, and the peripheral area 206 may be formed on the same plane, but a reduction in size or prevention of overflow of an adhesive agent may be achieved by providing the shoulder.

A rigid substrate such as a glass epoxy substrate, a composite substrate, a glass composite substrate, a Bakelite substrate, a ceramic substrate may be used as a material of which the base body 2 is formed. In particular, a ceramic substrate is preferable used in terms of heat discharging properties, and a ceramic laminated body is preferably used in terms of the formation of a wiring layer. Examples of a ceramic material which may be used here include silicone carbide, aluminum nitride, sapphire, alumina, silicone nitride, cermet, yttria, mullite, forsterite, cordierite, zirconia, and steatite.

The lid member 4 opposing the electronic device 1 has a function of protecting the electronic device 1. If the electronic device 1 is an image pickup element or a display element that treats light, being transparent to the light (typically, visible light) is required. Examples of the material preferable for the lid member 4 include plastic, glass, and crystal. A surface of the lid member 4 may be provided with an anti-reflection coating or an infrared-ray resistant coating.

Fixing members 8 and 9 described above are respectively solidified adhesive agents which are applied. Examples of the type of the adhesive agent include a dry-solid type solidified by evaporation of solvating media, a chemical reaction type solidified by polymerization of molecules caused by light or heat, and a heat melting (hot melt) type solidified by coagulation of the melted adhesive agent. Examples of typical adhesive agents include light-cured resins cured by a UV-ray or visible light, and heat-cured resins cured by heat. A heat-cured resin may be preferably used as the adhesive agent used for the fixing member for fixing the fixing member 8 and the electronic device 1, and a light-cured resin may be preferably used as the adhesive agent used for the fixing member 9. Colors of the adhesive agent or a joint member which can be used here are not specifically limited to, and white, black, and transparent may also be used in the case of the heat-cured resin. The light-cured resin is transparent for visible light and/or a UV-ray. The adhesive agent and the joint member may include inorganic or organic filler in moderation. Humidity resistant properties may be improved by including filler. The Young's moduli of the fixing members 8 and 9 after having cured the adhesive agent are not specifically limited. However, when adhering different materials to each other, a relatively soft resin (low rigidity resin) is preferable. For example, a range from 1 MPa to 100 GPa inclusive is preferable, however, the range is not limited thereto.

The frame member 3 will be described in detail. The frame member 3 includes the high rigidity portions (two portions, namely, the first portion 61 and the second portion 62 in this example), and the low rigidity portions (two portions, namely, the third portion 73, and the fourth portion 74 in this example).

Here, distinction between the high rigidity portions and the low rigidity portions is drawn by the height relationship of the Young's moduli of the materials which constitute the corresponding parts. In other words, the Young's moduli of the third portion 73 and the fourth portion 74 as the low rigidity portions is lower than the Young's moduli of the first portion 61 and the second portion 62 which are the high rigidity portions. For example, the Young's modulus of the low rigidity portion is preferably ½ or lower, and more preferably ¹⁄₁₀ or lower of the Young's moduli of the high rigidity portions. For example, the Young's modulus of the high rigidity portions is preferably 60 GPa or higher and, more preferably, 100 GPa or higher. For example, the Young's modulus of the low rigidity portion is 30 GPa or lower, preferably 10 GPa or lower and more preferably 10 GPa or lower. Since the Young's modulus is a physical property value of the material, the Young's modulus of each portion of the frame member 3 may be measured by measuring the Young's modulus of a sample of the same material as that of the corresponding portion in accordance with a method of measuring the Young's moduli defined by JIS or ISO. The height relationship in the Young's modulus may be figured out by pressing a probe to the respective portions of the frame member 3 with the same force, and inspecting the amounts of deformation of the respective portions at that time.

In this example, the first portion 61 and the second portion 62 which are the high rigidity portions have a substantially lateral symmetry angular U-shape, and surround the electronic device 1 in the X-Y direction when viewing from above from the side of the lid member 4. In a circumferential direction of the frame member 3, the third portion 73 and the fourth portion 74, which are respectively low rigidity portions, are located between the first portion 61 and the second portion 62, which are the high rigidity portions of the frame member 3. In this example, the third portion 73 and the fourth portion 74 are in contact with and joined to the first portion 61 and the second portion 62 respectively, whereby the first portion 61 and the second portion 62 are coupled to each other by the third portion 73 and the fourth portion 74, which are the low rigidity portions. The fourth portion 74 is located on the opposite side from the third portion 73 with respect to the first portion 61, and is located on the opposite side from the third portion 73 with respect to the second portion 62 along the circumferential direction.

In the circumferential direction of the frame member 3, the lengths of the first portion 61 and the second portion 62, which are the high rigidity portions of the frame member 3, is larger than the lengths of the third portion 73 and the fourth portion 74, which are the low rigidity portions of the frame member 3. The circumferential direction is determined as described below. First of all, a normal line of the inner edge 308 of the frame member 3 is determined for each portions of the inner edge 308. Subsequently, intermediate points between the inner edge 308 and the outer edge 307 of respective normal lines of the inner edge 308 are determined. The intermediate points between the inner edge 308 and the outer edge 307 are points located at equal distance from the inner edge 308 and the outer edge 307 of the respective normal lines of the inner edge 308. The circumferential direction is a direction along a line connecting the intermediate points determined on the respective normal lines. The "length in the circumferential direction" here is obtained by measuring the length of a line connecting the intermediate points of the inner edge 308 and the outer edge 307 of the frame member 3. Therefore, typically, the length in the circumferential direction is longer than the length of the inner edge 308 of the frame member 3 (the length of the inner periphery) and smaller than the length of the outer edge 307 (the length of the outer periphery). The normal lines for obtaining the intermediate points described above are determined so as to pass through intermediate points between an upper surface and a lower surface of the frame member 3. In other words, the intermediate points may be center points in a cross section vertical to the circumferential direction of the frame member 3.

Figure 2A:
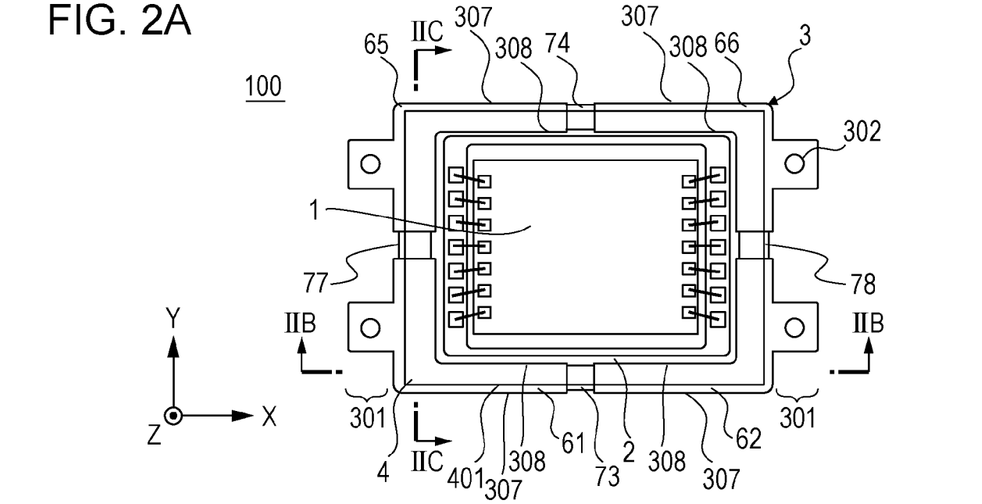
FIGS. 2A to 2C are a schematic plan view and schematic cross-sectional views illustrating an example of the electronic component.
Figure 2B:
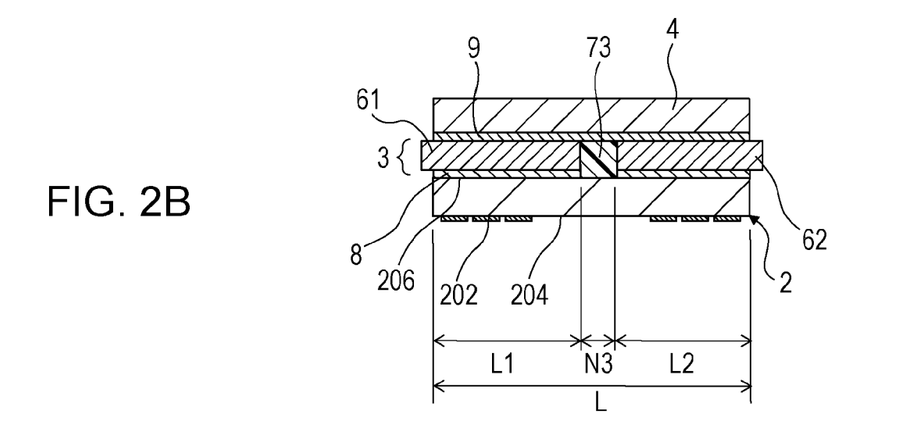
Figure 2C:
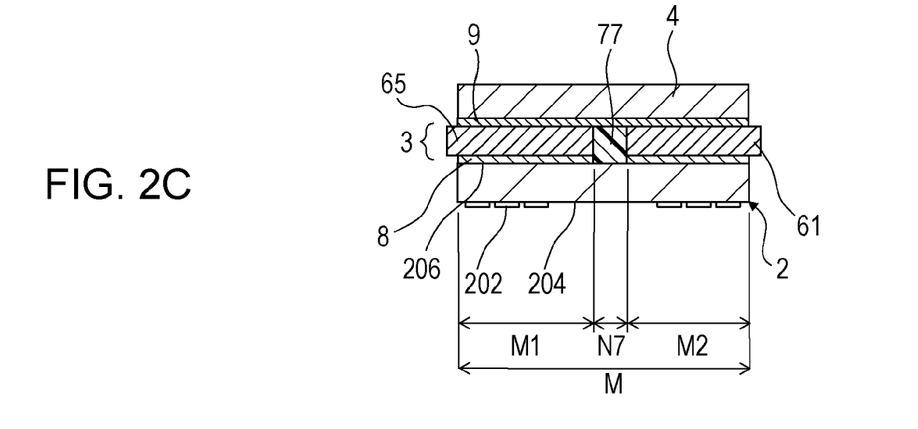

The frame member 3 has a quadrilateral shape. The four sides of the frame member 3 may have the same length, but include short sides and long sides in this example. In FIGS. 1A to 1D, the long sides includes an upper side and a lower side, which is an opposite side thereof, and the short sides includes a left side and a right side, which is an opposite side thereof. The length of the long side of the frame member 3 is defined as M, and the length of the short side is defined as L (L<M). In this example, the low rigidity portions are provided on the long sides of the frame member 3, and the low rigidity portions are not provided on the short sides. If the low rigidity portions are provided on either one of the long sides and the short sides, the long sides are more preferable than the short side. Although detail description will be given later, an example of deformation illustrated in FIGS. 2A to 2C is an example in which the low rigidity portions are provided on both of the long sides and the short sides. In other words, it can be said that the low rigidity portions are provided on at least long sides.

The low rigidity portion is located at a portion in the vicinity of a center of one side of the frame member 3. Then, on the one side, the high rigidity portions are located on both sides of the low rigidity portion. On the lower side in the FIG. 1A, the first portion 61, the second portion 62, and the third portion 73 are located and, in the circumferential direction, the third portion 73 is located between the first portion 61 and the second portion 62. In the same manner, on the upper side in the FIG. 1A, the first portion 61, the second portion 62, and the fourth portion 74 are located and, in the circumferential direction, the fourth portion 74 is located between the first portion 61 and the second portion 62. In this example, the configuration of the upper side and the lower side is line symmetry (vertical symmetry). However, the lengths or positions of the low rigidity portions may be different between the opposed two sides.

FIGS. 1B and 1D illustrate the lengths of the respective portions of the frame member 3 in the circumferential direction. The length of the first portion 61 on the lower side is defined as L1, and the length of the length of the second portion 62 on the lower side is defined as L2. The length of the first portion 61 in the circumferential direction is 2×L1+

M, and the length of the second portion 62 in the circumferential direction is $2 \times L2+M$. In contrast, the lengths of the third portion 73 and the fourth portion 74 are N3 and N4, respectively. As described above, a relationship of $N3<2\times L1+M$, $N3<2\times L2+M$, $N4<2\times L1+M$, and $N4<2\times L2+M$ are satisfied. $L1+L2+N3=L$ and $L1+L2+N4=L$ are satisfied and the length of the frame member 3 in the circumferential direction is $2\times L+2\times M$.

In the circumferential direction of the frame member 3, a sum of the lengths of all of the low rigidity portions having a Young's modulus, which is the same or lower than the Young's modulus of the third portion 73 is defined as S. In this example, the low rigidity portions are the third portion 73 and the fourth portion 74, and $S=N3+N4$. A sum of the lengths of all of the high rigidity portions having a Young's modulus, which is higher than the Young's modulus of the third portion 73, is referred to as H. In this example, the high rigidity portions are the first portion 61 and the second portion 62, and $H=2\times(L1+L2)+2\times M$ is satisfied. The sum S of the lengths of the low rigidity portions smaller than the sum H of the lengths of the high-rigidity portions ($S<H$) is effective in terms of increasing the rigidity of the frame member 3. In addition, the sum S of the lengths of the low rigidity portions is preferably ½ or lower of the sum H of the lengths of the high rigidity portions ($S \leq H/2$), and the sum S of the lengths of the low rigidity portions is further preferably ¼ or lower of the sum H of the lengths of the high rigidity portions ($S \leq H/2$).

Subsequently, with reference to FIGS. 1A to 1D, the length of the low rigidity portion in the circumferential direction will be described. In the case where the low rigidity portions are in contact with the high rigidity portions on both sides thereof, the length of the low rigidity portions in the circumferential direction is equal to the distance between the high rigidity portions. Reference signs N3 in FIG. 1D illustrate the length of the low rigidity portions and the length thereof is preferably 0.1 mm to 10 mm inclusive. When the length N3 is smaller than 0.1 mm, formation of the low rigidity portion becomes difficult. When the length N3 is larger than 10 mm, there may arise a problem that the rigidity as the frame member 3 becomes insufficient, or a problem of tendency of lowering of hermeticity with respect to the internal space 5.

The frame member 3 of this example includes a first high rigidity member which constitutes part of the first portion 61, a second high rigidity member which constitutes part of the second portion 62 and being different from the first high rigidity member, a first low rigidity member which constitutes part of the third portion 73 and being different from the first high rigidity member and the second high rigidity member, and a second low rigidity member which constitutes part of the fourth portion 74 and being different from the first high rigidity member and the second high rigidity member, combined each other.

The frame member 3 includes the first high rigidity members located on the lower side, the left side, and the upper side, and the second high rigidity members located on the lower side, the right side, and the upper side. The first high rigidity members constitute the first portion 61, and the second high rigidity members constitute the second portion 62, respectively. These high rigidity members are respectively members formed of metal (metallic members).

The frame member 3 includes two of the low rigidity members. The first low rigidity member which constitutes part of the third portion 73 is provided between the first high rigidity member and the second high rigidity member on the lower side. The second low rigidity member which constitutes part of the fourth portion 74 is provided between the third high rigidity member and the fourth high rigidity member on the upper side. These low rigidity members are respectively members formed of a resin (resin members).

The first high rigidity member and the first low rigidity member are in contact with each other, the second high rigidity member and the first low rigidity member are in contact with each other, the first high rigidity member and the second low rigidity member are in contact with each other, and the second high rigidity member and the second low rigidity member are in contact with each other. The first high rigidity member and the second high rigidity member are fixed to the base body 2 via the first fixing member 8.

The first high rigidity member and the second high rigidity member which constitute part of the high rigidity portions are generally referred to as high rigidity members, and the first low rigidity members and the second low rigidity members which constitute part of the low rigidity portions are generally referred to as low rigidity members. The high rigidity member and the low rigidity member do not necessarily have to be in contact with each other, and the adhesive member which adheres the both to each other may be present between the high rigidity member and the low rigidity member. The adhesive member is capable of functioning as an additional low rigidity member if the Young's modulus is lower than that of the high rigidity member to be adhered, and the length in the circumferential direction is smaller than that of the high rigidity member. The adhesive member is capable of functioning as an additional high rigidity member if the Young's modulus is higher than that of the low rigidity member to be adhered, and the length in the circumferential direction is longer than that of the low rigidity member.

Although the third portion 73 and the fourth portion 74 are fixed to the base body 2 in contact with the base body 2 without intermediary of the fixing member 8 in this example, the third portion 73 and the fourth portion 74 may be fixed to the base body 2 via the fixing member 8. Although the first portion 61, the second portion 62, the third portion 73, and the fourth portion 74 are adhered to the lid member 4 via the fixing member 9, the third portion 73 and the fourth portion 74 may be fixed to the lid member 4 in contact with the lid member 4 without the intermediary of the fixing member 9.

Examples of the material which can be preferably used as the material of the high rigidity portions (high rigidity material) is generally an inorganic material having a high rigidity, and a metallic material is further preferably when heat discharging properties and machinability are considered. As examples of the metallic material include, for example, aluminum, aluminum alloy, copper, copper alloy, iron, and iron alloy. These metallic materials are superior in machinability, and are relatively low price. In the case where the electronic device 1 is an image pickup element, aluminum, aluminum alloy, and iron alloy superior in corrosion resistance are preferable when considering an outdoor use. Furthermore, examples of the preferable material of the high rigidity portion include the iron alloy including a stainless steel as a representative material and, in addition chrome and nickel. Examples of such a material which can be used here include SUS430, which is a ferrite stainless steel, or SUS304, which is austenite stainless steel. In particular, as a combination between the material of the base body 2 and the high rigidity portions, ceramic is preferably used as the material of the base body 2 and a stainless steel is preferably used as the material of the high rigidity portions in terms of heat discharging properties, machinability, productivity, and costs.

Examples of the material which may be preferably used as the material of the low rigidity portions (low rigidity material) is generally an organic material having a low rigidity, and a resin material is further preferably when chemical stability and the machinability are considered. Examples of the resin material include, for example, an epoxy resin, an acrylic resin, a silicone resin, and a vinyl resin. Examples of the organic material include a dry-solid type solidified by evaporation of solvating media, a chemical reaction type solidified by polymerization of molecules caused by light or heat, and a heat melting (hot melt) type solidified by coagulation of the melted material. Typically, a light-cured resin which is cured by a UV-ray or visible light or a heat-cured resin which is cured by heat may be used. When a high value is put on the humidity resistant properties with respect to the electronic device 1, a heat-cured epoxy resin containing a sufficient amount of gas filler is preferably used. When forming the low rigidity member, a liquid type or B-stage type adhesive agent, a photosensitive film, a sheet adhesive agent such as hot melt may be used and, as other examples, a gel sheet, a viscous rubber sheet, and a double-sided tape may be used. These materials have a sufficiently lower Young's modulus in comparison with a general metallic material.

The electronic device 1 is preferably hermetically sealed. However, an air-ventilating hole between the internal space 5 and the external space may be provided by using part of the low rigidity portion 7 or part of the distance between the first portion 61 and the second portion 62, which are high rigidity portions. The low rigidity portions may be arranged in the periphery of the high rigidity portions not only between the first portion 61 and the second portion 62 which is the high rigidity portions, but also in the periphery of the high rigidity portions.

The frame member 3 includes expanded portions 301 as portions which do not overlap with the base body 2 in addition to the portion overlapping with the base body 2. The portion overlapping with the base body 2 is fixed to the base body 2 via the fixing member 8. The portions which do not overlap with the base body 2 are portions located outside the outer edge 307 of the frame member 3 in an orthogonal projection from the base body 2 to the frame member 3. The expanded portions 301 are portions extending from above the base body 2 toward the external space. A length W2 of the expanded portions 301 in radial directions (X and Y directions) of the frame member 3 is longer than a length W1 of the portion of the frame member 3 overlapping with the base body 2 in the radial direction (X and Y directions) of the frame member 3. The sum of the length W1 and the length W2 is a length in the radial direction of the frame member 3, is a width of the frame member 3, and is a distance from the inner edge to the outer edge of the frame member 3. The radial direction of the frame member 3 is a direction connecting the outer edge 307 and the inner edge 308 of the frame member 3 and, for example, a direction vertical to the inner edge 308. The expanded portions 301 are high rigidity portions, and part of the first portion 61 and the second portion 62. In this example, the expanded portions 301 are provided on the short sides (left side and right side) of the frame member 3. However, the expanded portions 301 may be also provided on the long sides, and may be provided on all of the four sides. The expanded portions 301 may not be provided.

The expanded portions 301 are provided with through holes 302. The through holes 302 may be used as holes for screwing for fixation to the housing which is provided on the electronic device, or as holes for positioning. The expanded portions 301 come into contact with other heat discharging members such as the housing of the electronic device, and hence the expanded portions 301 may be used as heat discharging devices that discharge heat generated from the electronic device 1.

Subsequently, the effects achieved by providing the high rigidity portions and the low rigidity portions on the frame member 3 will be described. Here, with reference to FIGS. 1A to 1D, the frame member 3 formed entirely of the high-rigidity material and having no low rigidity portion (the third portion 73 and the fourth portion 74) will be considered. In this case, an adhesive area having the longest linear distance in an adhesive area between the base body 2 and the frame member 3 is the long side (upper side and lower side) having a length indicated by L in FIG. 1B. A portion affected most by a stress caused by thermal expansion or thermal contraction of at least one of the frame member 3 and the base body 2 is the long side which is a portion having the longest linear distance. The longer the length of the side (the magnitude of L), the larger the influence of the frame member 3, and the degree of deformation of the electronic component 100 is increased. The relationship between the frame member 3 and the lid member 4 is also the same.

Difference in magnitude of displacement caused by thermal expansion or thermal contraction between the base body 2 and the frame member 3 (high rigidity portions) may be generated by being different in coefficient of linear expansion between the base body 2 and the frame member 3 (high rigidity portions). In the same manner, difference in magnitude of displacement caused by thermal expansion or thermal contraction between the frame member 3 (high rigidity portions) and the lid member 4 may be generated by being different in coefficient of linear expansion between the frame member 3 (high rigidity portions) and the lid member 4. In particular, when the coefficient of linear expansion of the frame member 3 (high rigidity portion) is larger than that of at least one of the base body 2 and the lid member 4, the influence of the thermal expansion or the thermal contraction of the frame member 3 is significant. However, even though the coefficient of linear expansion of the frame member 3 is equal to that of the base body 2 or the lid member 4, the influence of the thermal expansion or the thermal contraction, that is, a thermal stress may be generated depending on the difference in shape or temperature.

In contrast, in this embodiment, the frame member 3 includes a plurality of the high rigidity portions, and in this example, includes the first portion 61 and the second portion 62 as the high rigidity portions. Then, the third portion 73 and the fourth portion 74, which are the low rigidity portions, are provided at substantially centers of the long sides between the plurality of high rigidity portions.

In this case, the lengths of the adhesive area on the long side are L1 and L2 illustrated in FIG. 1D. Then, if the lengths N3 and N4 are made sufficiently small in comparison with the length L, the values of L1 and L2 are approximately half the L described above. Since the deformation on the basis of the coefficient of linear expansion is significantly affected by the length of the adhesive area, at least the amount of expansion and contraction due to heat may be reduced to approximately a half. Therefore, the deformation can be reduced. In the relationship between the lid member 4 and the frame member 3 as well, the deformation can be reduced from the same reasons.

In an example illustrated in FIGS. 1A to 1D, an example in which the two high rigidity portions are provided has been described. However, the number of the high rigidity portions may be three or more. The larger the number of the high rigidity portions, the more the influence of the deformation can be reduced. In the case in which the electronic component 100 has a rectangular shape, the high rigidity portion is provided preferably on the long side. However, in the case of a square, the high rigidity portion may be provided on any side. The low rigidity portion located between the plurality of high rigidity portions is preferably provided at the center of a side of the frame member 3. Even with a mode in which the frame member 3 is composed of one high rigidity member and one low rigidity member, a certain effect is achieved in terms of a reduction of the influence of the thermal stress. The certain effect is achieved only in a configuration in which part including one high rigidity member corresponds to a first high rigidity portion, another part of the one high rigidity member corresponds to a second high rigidity portion, and the first high rigidity portion and the second high rigidity portion are arranged so as to interpose the one low rigidity member therebetween in the circumferential direction of the frame member 3. This is because the influence of the thermal expansion and the thermal contraction of the frame member 3 may be absorbed by the deformation of the low rigidity portions in the circumferential direction of the frame member 3.

As modification of the embodiment, FIGS. 2A to 2C illustrates an example in which the frame member 3 has four portions, namely, the first portion 61, the second portion 62, a fifth portion 65 and a sixth portion 66. FIG. 2A is a plan view, FIG. 2B is a cross-sectional view taken along the line IIB-IIB, and FIG. 2C illustrates a cross-sectional view taken along the line IIC-IIC. The frame member 3 includes a seventh portion 77 located between the first portion 61 and the fifth portion 65 as a low rigidity portion having a Young's modulus lower than those of the first portion 61 and the fifth portion 65. The frame member 3 has an eighth portion 78 located between the second portion 62 and the sixth portion 66 as a low rigidity portion having a Young's modulus lower than those of the second portion 62 and the sixth portion 66.

The frame member 3 includes the first high rigidity members located on the lower side and the left side, the second high rigidity members located on the lower side and the right side, the third high rigidity members located on the upper side and the right side, and the fourth high rigidity member located on the upper side and the right side. The first high rigidity members constitute part of the first portion 61, the second high rigidity members constitute part of the second portion 62, the third high rigidity members constitute part of the fifth portion 65, and the fourth high rigidity members constitute part of the sixth portion 66, respectively. These high rigidity members are typically members formed of metal (metallic members) respectively.

The frame member 3 includes four low rigidity members. The first low rigidity member which constitutes the third portion 73 is located between the first high rigidity member and the second high rigidity member on the lower side. The second low rigidity member which constitutes the fourth portion 74 is located between the third high rigidity member and the fourth high rigidity member on the upper side. A third low rigidity member which constitutes the seventh portion 77 is located between the first high rigidity member and the third high rigidity member on the left side. A fourth low rigidity member which constitutes the eighth portion 78 is located between the second high rigidity member and the fourth high rigidity member on the right side. These low rigidity members are typically members formed of resin (resin members) respectively.

The seventh portion 77 and the eighth portion 78 are provided in the vicinities of the centers of the short sides thereof. The length of the high rigidity portions in the X-direction, which is the long side direction, is the same as that in FIGS. 1A to 1D, and the lengths of the high rigidity portions in the Y-direction, which is the short side direction, are M1 and M2 as illustrated in FIG. 2C. The length of the low rigidity portion in the Y-direction, which is the short side direction is N7. M1+N2+N7=M The lengths of the four portions, namely, the first portion 61, the second portion 62, the fifth portion 65, and the sixth portion 66, are L1+M2, L2+M2, L1+M1>N7, L2+M2. The lengths of the seventh portion 77 and the eighth portion 78 in the circumferential direction are, respectively, N7 and N8, and have a relationship of L1+M2>N7, L2+M2>N8, L1+M1>N7, and L2+M2>N8. The third portion 73 and the fourth portion 74 are the same as in FIGS. 1A to 1D, and hence description will be omitted. N1 and N7 may be the same and may be different. For example, the length N7 of the low rigidity member on the short side may be smaller than the length N3 of the low rigidity member on the long side. In this example, not only the length of the adhesive area on the long side, but also that on the short side may be reduced, so that the influence of expansion and contraction in association with the coefficient of linear expansion may be reduced on the short side as well.

As described thus far, the electronic component 100 of this embodiment may restrain the deformation of the component members which cover the electronic device 1 against the thermal stress caused by an external environment and by a change in temperature such as heat generation of the electronic device, so that the electronic component 100 with high degree of reliability is provided.

Second Embodiment

Subsequently, a first method of manufacturing the electronic component will be described with reference to FIGS. 3A-1 to 3D-2 as a second embodiment. In FIGS. 3A-1 to 3D-2, the top drawings illustrate the manufacturing method when viewing the electronic component 100 from the front, and bottom drawings are schematic cross-sectional views taken along the line indicated in the left drawings.

Figure 3A:
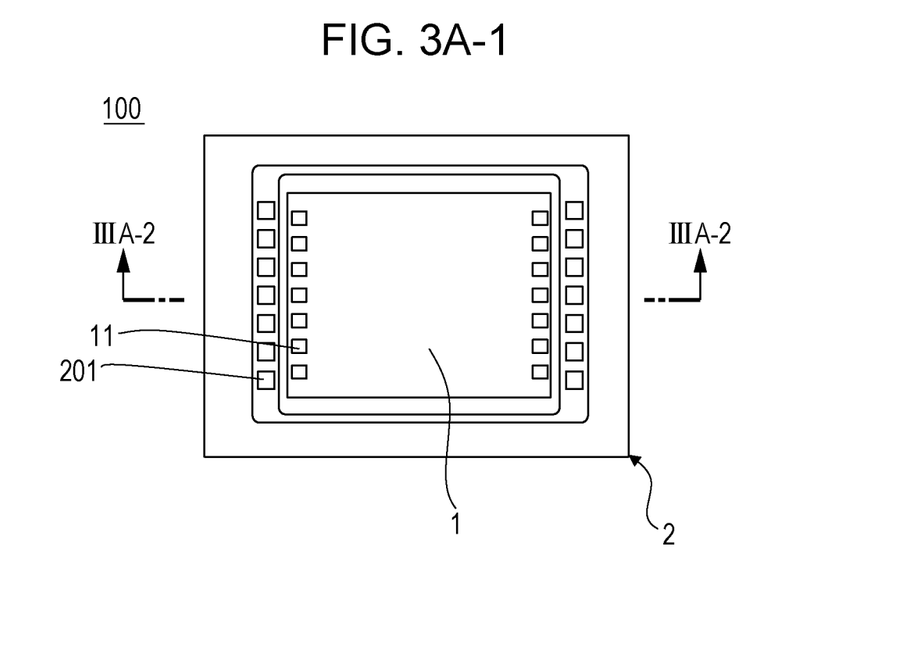
Figure 3A:
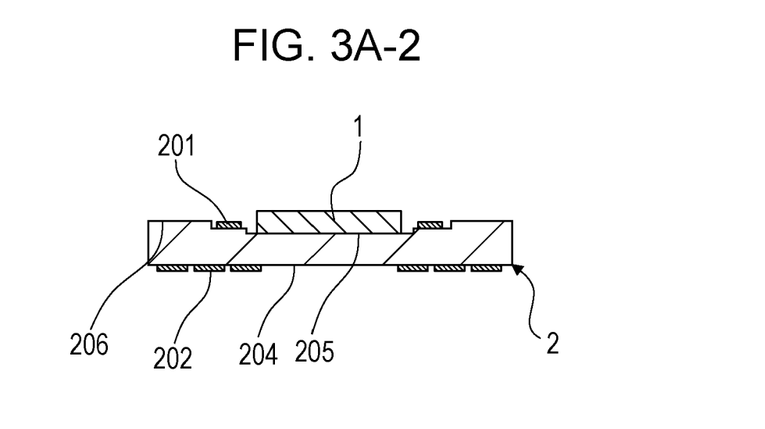

FIGS. 3A-1 and 3A-2 are drawings for explaining a process of fixing the electronic device 1 to the center area 205 of the base body 2. The process of mounting the electronic device 1 on the base body 2 includes applying an adhesive agent such as die bond paste on at least one of the center area 205 of the base body 2 and a back side of the electronic device 1, adhering the both to each other, and fixing the electronic device 1 onto the base body 2.

The base body 2 is obtained by punching green sheet formed by using a sheet molding method such as a doctor blade method or a calendar roll method into a plate shape, and laminating a plurality of the green sheets to form a row ceramic plate member. The internal terminals 201, the embedded portion and the external terminals 202 are formed by sintering a conductive paste pattern formed by screen printing method in the process of laminating the green sheets.

Figure 3B:
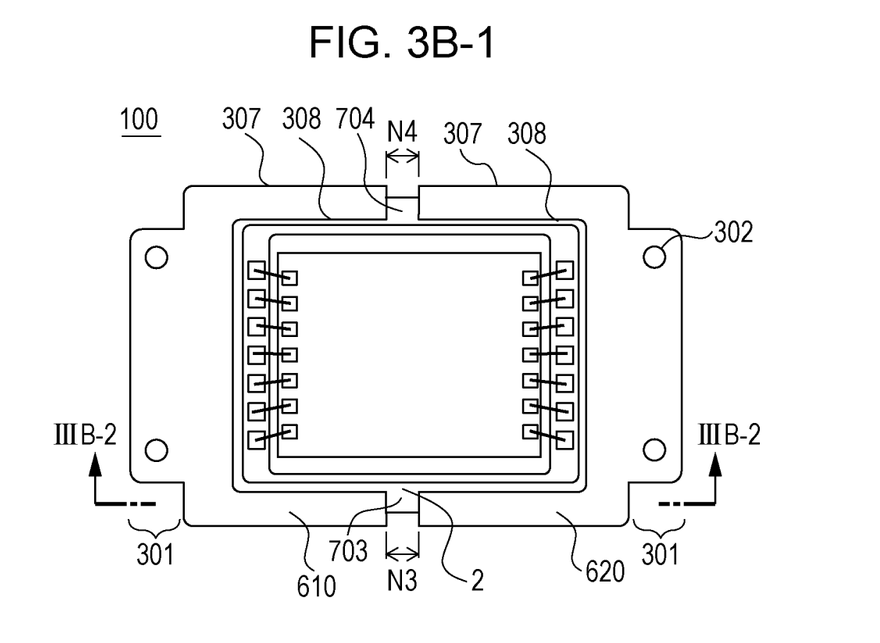
Figure 3B:
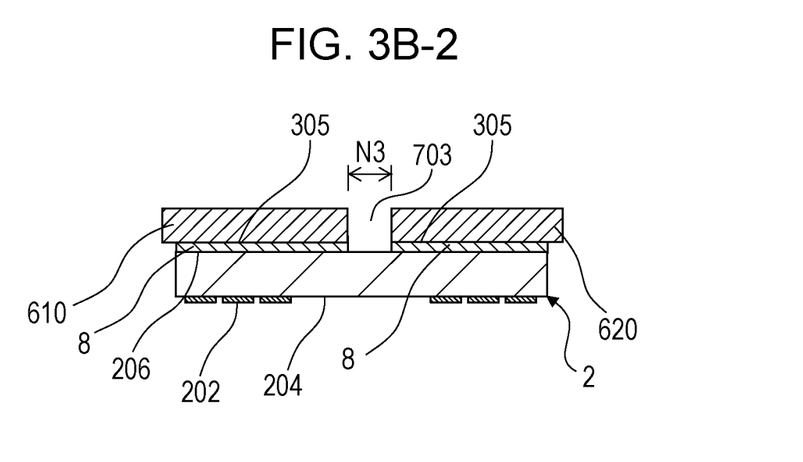
Figure 3C:
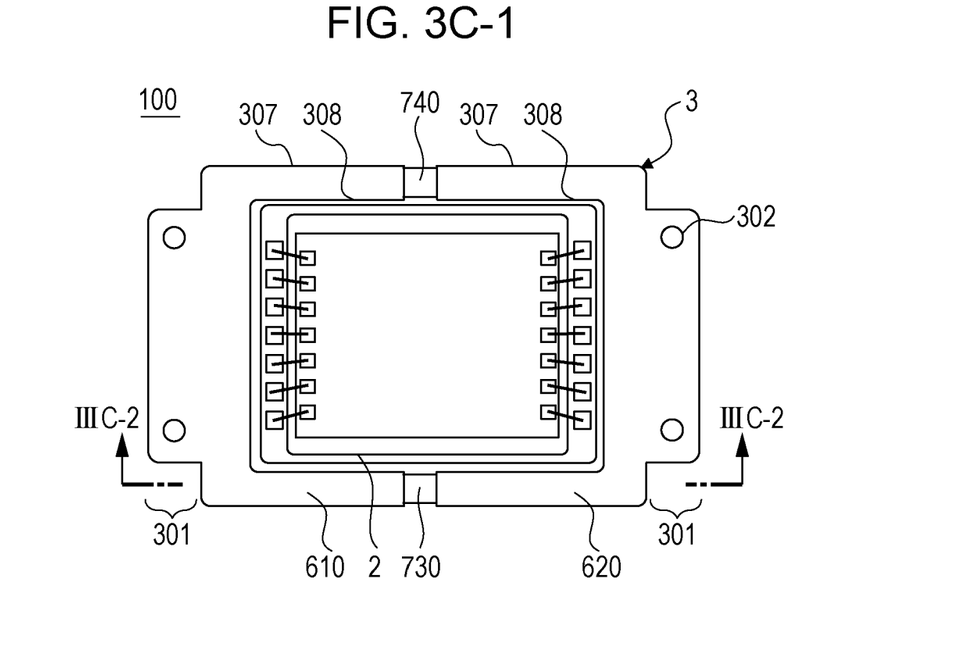
Figure 3C:
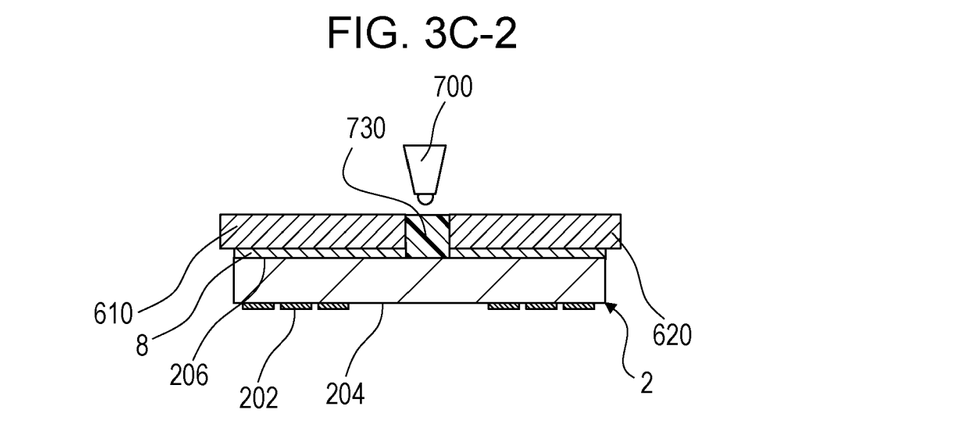
Figure 4A:
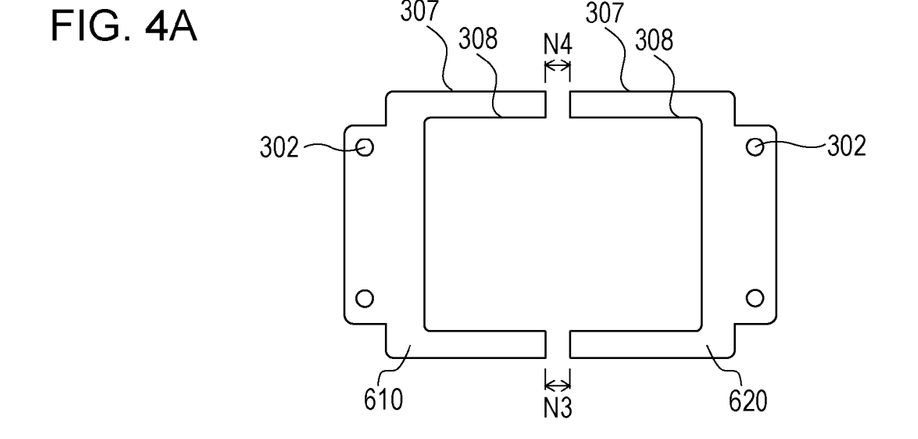
FIGS. 4A to 4C are schematic plan views illustrating an example of the method of manufacturing the electronic component.

FIGS. 3B-1 and 3B2 and 3C-1 and 3C-2 show a process of forming the frame member 3 on the peripheral area 206 of the base body 2. In this embodiment, a first high rigidity member 610, which corresponds to the first portion 61 and a second high rigidity member 620, which corresponds to the second portion 62 as the high rigidity portions of the frame member 3 are prepared as an angular U-shaped high rigidity members as illustrated in FIG. 4A. The first high rigidity member 610 and the second high rigidity member 620 are formed by various method such as casting, metal molding, cutting and the like of a metallic material.

FIGS. 3B-1 and 3B-2 illustrates a stage of arranging the first high rigidity member 610 and the second high rigidity member 620 which correspond to a plurality of the high rigidity members between the first high rigidity member 610 and the second high rigidity member 620 via gaps 703 and 704 having lengths of N3 and N4, and fixing the high rigidity member to the base body 2 via the fixing member 8. Specifically, the gap 703 is located between one end of the first high rigidity member 610 and one end of the second high rigidity member 620, and the gap 704 is located between the other end of the first high rigidity member 610 and the other end of the second high rigidity member 620. FIGS. 3B-1 and 3B-2 illustrate an example in which the first high rigidity member 610 and the second high rigidity member 620 adhered to the left side and the right side of the peripheral area 206.

As a method of fixedly adhering the first high rigidity member 610 and the second high rigidity member 620 as the high rigidity members onto the base body 2, for example, a liquid state heat-cured adhesive agent may be used. The adhesive agent is applied on at least one of lower surfaces 305 of the first high rigidity member 610 and the second high rigidity member 620 or the peripheral area 206 of the base body 2. Since application of the adhesive agent to a plurality of the high rigidity members is a complicated operation, application of the adhesive agent to the base body 2 is preferable. Subsequently, the fixing member 8 is formed by hardening the adhesive agent by heat or the like. Accordingly, the first high rigidity member 610 and the second high rigidity member 620 are fixed onto the base body 2. The two or more high rigidity members may be adhered together at the same time, or may be adhered separately. In particular, hardening the adhesive agent with heat has a significant advantage especially when forming the frame member 3 with a plurality of high rigidity members. The reason is that the length of the adhesive area between the one high rigidity member and the base body 2 is smaller than the case where the frame member 3 is composed of a single high rigidity member, and hence a thermal stress generated when the adhesive agent is cooled down from a hot state at the time of thermal curing may be reduced.

As illustrated in FIGS. 3B-1 and 3B-2 and FIG. 4A, the first high rigidity member 610 and the second high rigidity member 620 are provided respectively with the expanded portion 301 having through holes 302 formed therein. In this case, the positional relationship between the first high rigidity member 610 and the second high rigidity member 620 of the base body 2 can be adjusted with high degree of accuracy by using the through holes 302 formed in the first high rigidity member 610 and the second high rigidity member 620, which are the high rigidity portions. By providing the apparatus for adhesion with an image recognizing function, improvement of the adhesion process is automated and a positioning accuracy is achieved by automating the adhesion process.

FIGS. 3C-1 and 3C-2 are drawings for explaining a stage in which the low rigidity members are arranged in the gaps 703 and 704 between the high rigidity members. The first low rigidity member 730 and a second low rigidity member 740 which are the low rigidity portions are arranged in the gaps 703 and 704 of the first high rigidity member 610 and the second high rigidity member 620 as a high rigidity member adhered in the process in FIGS. 3B-1 and 3B-2. The first high rigidity member 610 and the second high rigidity member 620 which are the high rigidity members may be coupled in the circumferential direction by a first low rigidity member 730 and the second low rigidity member 740. The Young's modulus of the first low rigidity member 730 and the second low rigidity member 740 is lower than the Young's modulus of the first high rigidity member 610 and the second high rigidity member 620. Accordingly, the first high rigidity member 610 constitutes part of the first portion 61 having a high rigidity, and the second high rigidity member 620 constitutes part of the second portion 62 having a high rigidity, the first low rigidity member 730 constitutes part of the third portion 73 having a low rigidity, and the second low rigidity member 740 constitutes part of the fourth portion 74 having a low rigidity.

Examples of the method of forming the low rigidity member includes, in addition to a method of fitting or inserting the solid low rigidity members formed in advance into the gaps 703 and 704, a method of forming a low rigidity member including applying or infusing a liquid-state precursor into the gap 703 and then solidifying the liquid-state precursor. As described above, the lengths N3 and N4 of the gaps 703 and 704 are preferably 0.1 mm to 10 mm. In this case, the liquid-state resin is applied to the gaps 703 and 704 by using a dispenser 700 or the like and then is light cured or heat cured, so that the first low rigidity member 730 and the second low rigidity member 740 are formed. The first low rigidity member 730 and the second low rigidity member 740 may not be accommodated only in the gaps 703 and 704 between the first high rigidity member 610 and the second high rigidity member 620, which are the high-rigidity portions but may be protruded from the gaps 703 and 704. In other words, the first low rigidity member 730 and the second low rigidity member 740 may be arranged on upper surfaces of the first high rigidity member 610 and the second high rigidity member 620 to which the lid member 4 is to be adhered, and further on a side surface which forms an outer edge 307.

In this manner, the mounted member provided with the base body 2 and the frame member 3 may be manufactured. The frame member 3 may only surround a space above the center area located at the orthogonal projection in the center area of the base body 2. In FIGS. 3A-1 to 3C-2, an example in which the electronic device 1 is mounted on the base body 2 and then the frame member 3 is formed is illustrated. However, a configuration in which the frame member 3 is formed on the base body 2 and then the electronic device 1 is mounted thereon is also applicable.

Figure 3D:
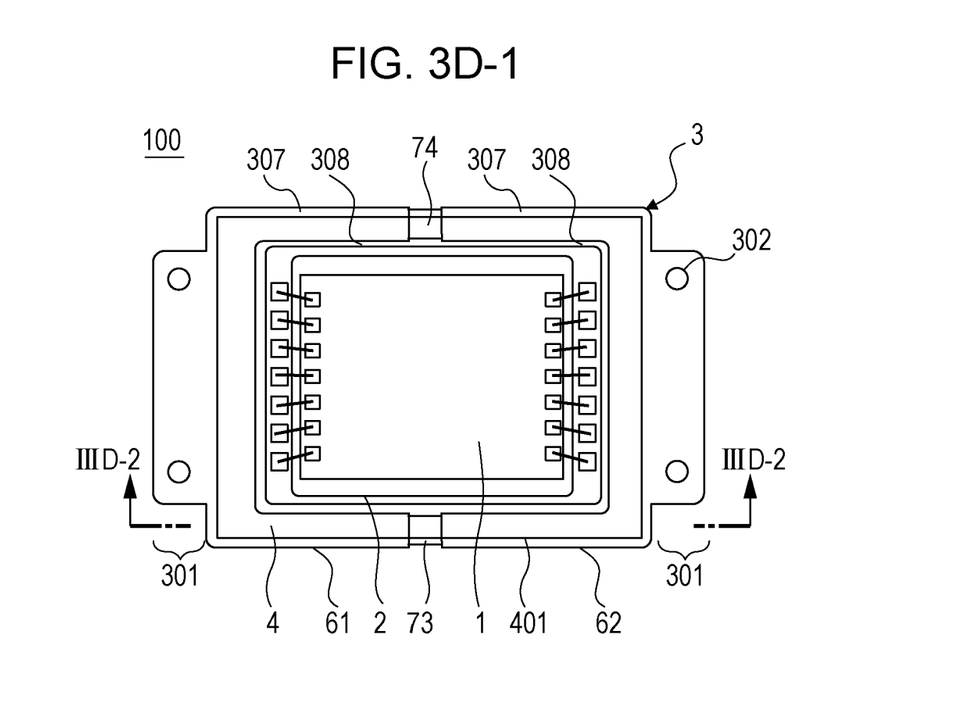
Figure 3D:
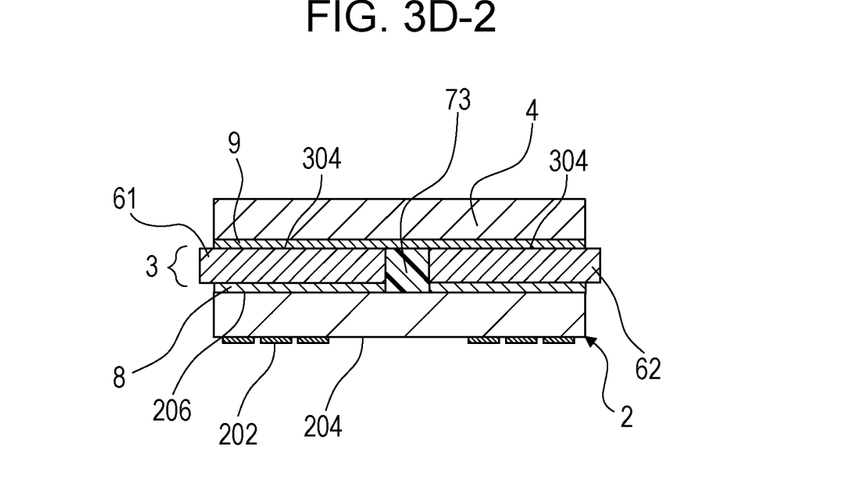

FIGS. 3D-1 and 3D-2 illustrate a process of adhering the lid member 4 to the frame member 3. The adhesive agent is applied at least on one of an upper surface 304 of the frame member 3 and the lid member 4. By hardening the adhesive agent, the fixing member 9 is formed and the lid member 4 is fixed to the frame member 3 via the fixing member 9. As the adhesive agent which serves as the fixing member 9, a light-cured resin or a heat-cured resin may be used. However, the light-cured resin is more preferable. The reason is that the thermal stress generated by a change in temperature may cause deformation of the electronic component 100 and lowering of adhesiveness of the lid member 4 due to the thermal expansion of the internal space 5. By using the lid member 4 transparent with respect to the light such as a UV-ray, exposure of the adhesive agent via the lid member 4 is enabled.

With the low rigidity member and the fixing member 9 formed of the same material, application of the adhesive agent which serves as the fixing member 9 in the gap of the high rigidity member and arrangement of the adhesive agent which serves as the fixing member 9 on an upper surface of the high rigidity member may be performed continuously. Accordingly, the process of forming the frame member 3 and the process of adhering the lid member 4 to the frame member 3 may be performed in parallel and hence the process of manufacturing may be simplified.

Here, a method of enhancing the accuracy of positioning in the process of arranging a plurality of the high rigidity members in the peripheral area 206 of the base body 2 with gaps therebetween and adhering the high rigidity members to the base body 2 will be described.

Figure 4B:
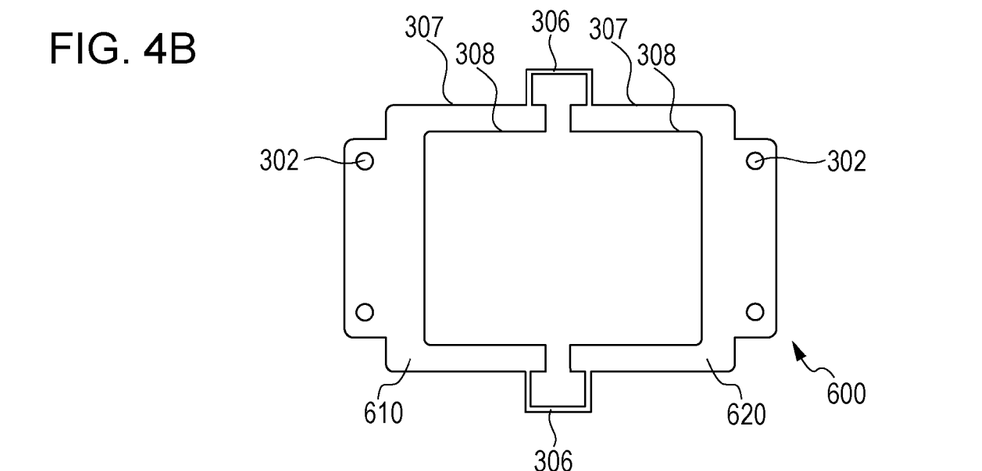

FIG. 4B illustrates a case where a plurality of high rigidity members are prepared as an assembly being coupled with coupling portions 306 that define a relative position in advance. A frame member 600 which is an assembly of the high rigidity members may be manufactured mainly through a process of mainly a punching, laser cut, etching, and casting of a flat plate. The frame member 600 is prepared in a state of having the coupling portion 306 formed of the same material as the high rigidity member which constitutes part of the high-rigidity portion so as to fix the relative position in advance. The shape of the coupling portions 306 is not specifically limited. By using the frame member 600, since the coupling portions 306 are formed, the plurality of high rigidity members may be arranged with high degree of accuracy while maintaining the relative position.

Although the electronic component 100 may be used in a state in which the coupling portions 306 are provided. However, since the size of the electronic component 100 is increased, the coupling portions 306 may be removed in the process after being adhered to the base body 2. In the manner as described above, the electronic component 100 may be manufactured.

The electronic component 100 manufactured in the manufacturing method as described above may restrain the deformation of the component members which cover the electronic device 1 against the thermal stress caused by a change in external environment by a change in temperature, so that the electronic component 100 with high degree of reliability is provided.

Third Embodiment

Figure 5A:
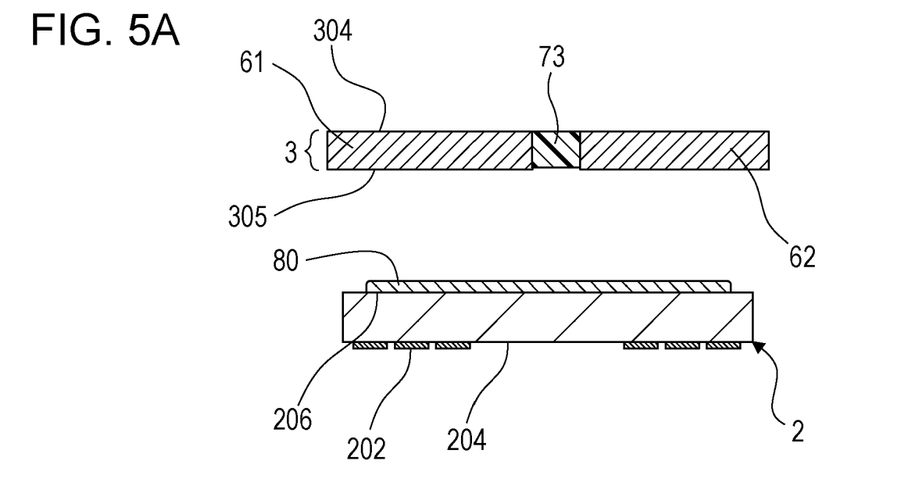
FIGS. 5A to 5C are schematic cross-sectional views illustrating an example of the method of manufacturing the electronic component.
Figure 5B:
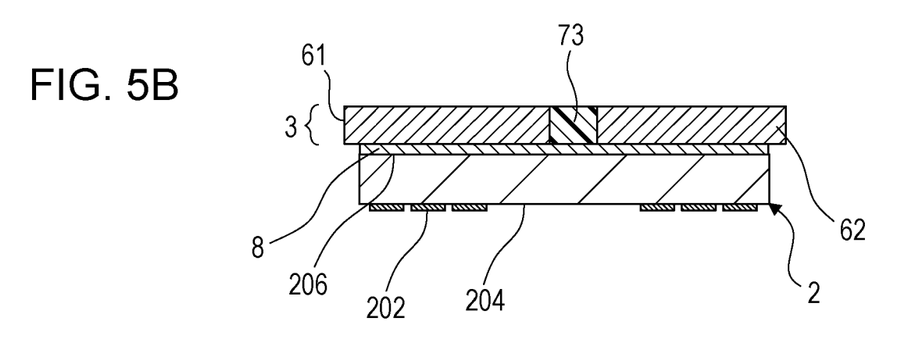
Figure 5C:
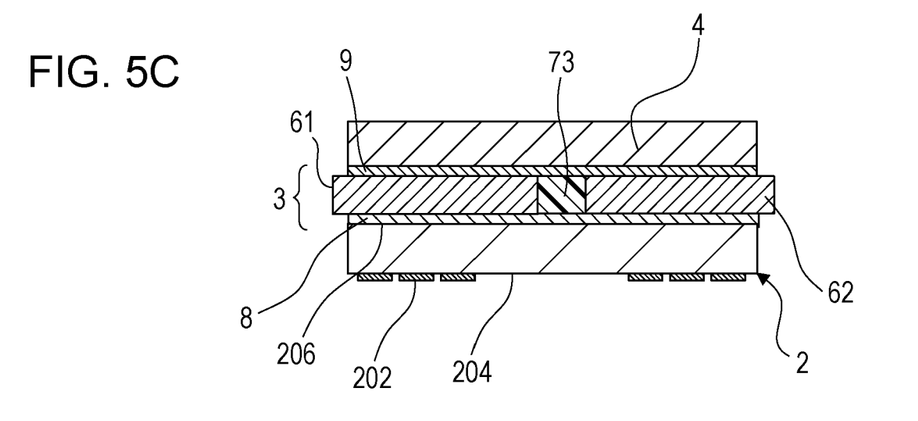

Subsequently, a second method of manufacturing the electronic component 100 will be described with reference to FIGS. 5A to 5C as a third embodiment. FIGS. 5A to 5C illustrate the second method of manufacturing the electronic component 100, and is a cross section taken along the lines V-V in FIGS. 1A and 1B.

FIGS. 5A and 5B illustrate a process of fixing the frame member 3 in the second process of manufacturing the electronic component.

In the first manufacturing method, the high rigidity member is fixed to the base body 2, and then the low rigidity portions are arranged to form the frame member 3. In contrast, in the second manufacturing method, the frame member 3 having the high rigidity portions and the low rigidity portions is prepared in advance, and then the frame member 3 is fixed to the base body 2.

FIG. 5A illustrates the process of preparing the frame member 3 having the first portion 61, the second portion 62, the third portion 73, and the fourth portion 74. FIG. 5A also illustrates a process of applying an adhesive agent 80 to at least one of the peripheral area 206 of the base body 2 and the lower surface 305 of the frame member 3 by a dispense method or the like. A liquid-state heat-cured adhesive agent may be used as the adhesive agent 80.

The frame member 3 of FIG. 5A may be fixed to the peripheral area 206 of the base body 2 by using, for example, a liquid-state heat-cured adhesive agent in the same manner as the fixation of the high rigidity member in the first manufacturing method.

Manufacture of the frame member 3 may be performed in the following manner. First of all, in the same manner as the first manufacturing method, the first high rigidity member 610 which corresponds to the first portion 61 and the second high rigidity member 620 which corresponds to the second portion 62, which are the high rigidity portions of the frame member 3 are prepared as illustrated in FIG. 4A. The first high rigidity member 610 and the second high rigidity member 620 are prepared as the high rigidity members having an angular U-shape. Subsequently, the first high rigidity member 610 and the second high rigidity member 620 which correspond to the high rigidity portions are arranged via the gaps 703 and 704 having the lengths N3 and N4. At this time, by passing the positional pins into the through holes 302 by using the apparatus having positioning pins, which are not illustrated, the lengths N3 and N4 of the gaps 703 and 704 may be stably controlled. Instead of the high rigidity members, which are not coupled and are separated as illustrated in FIG. 4A (the first high rigidity member 610 and the second high rigidity member 620), the frame member 600 having the coupling portions 306 as in FIG. 4B may also be used.

Figure 4C:
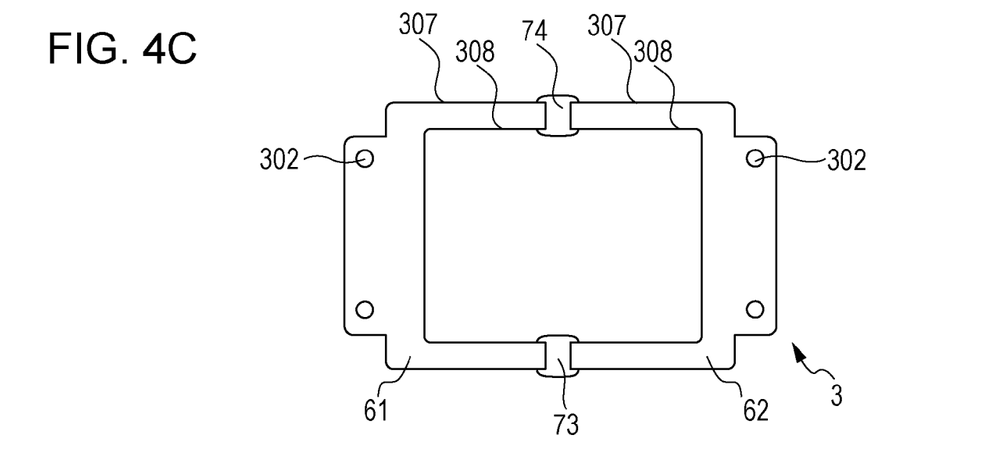

Subsequently, as illustrated in FIG. 4C, the low rigidity members (the first low rigidity member 730 and the second low rigidity member 740) which correspond to the low rigidity portions of the frame member 3 are arranged in the gaps 703 and 704. The first high rigidity member 610 and the second high rigidity member 620 are coupled by the first low rigidity member 730 and the second low rigidity member 740. In this manner, the frame member 3 in which the first high rigidity member 610 constitutes part of the first portion 61 having a high rigidity, and the second high rigidity member 620 constitutes part of the second portion 62, which is the high rigidity portion, the first low rigidity member 730 constitutes part of the third portion 73, which is the low rigidity portion, and the second low rigidity member 740 constitutes part of the fourth portion 74, which is the low rigidity portion is manufactured.

The arrangement of the first low rigidity member 730 and the second low rigidity member 740 which are the low rigidity members may be implemented in the same manner as that performed on the base body 2 in the first manufacturing method. As a detailed method, the gaps 703 and 704 may be filled with the liquid-state resin by using the dispense method or printing method. In addition, a method of forming the low rigidity members 730 and 740 by a metal mold method (resin mold method) by using the heat-cured resin or a thermoplastic resin represented by a transfer mold method may be selected. The resin mold method is not only superior in productivity, but also superior in ease of providing a mold with a mechanism which contributes to an arrangement with high degree of accuracy in a stage of arranging the first high rigidity member 610, the second high rigidity member 620 via the gaps 703 and 704. Since the restriction of outlines of the low rigidity members 730 and 740 formed of a resin with high degree of accuracy is enabled, formation of the frame member 3 having an outline with high degree of accuracy and having a high degree of flatness is achieved.

FIG. 5B illustrates a state after the frame member 3 is placed in the peripheral area 206 of the base body 2, and the fixing member 8 is formed by curing the adhesive agent 80 by the heat-cured process or the like.

FIG. 5C illustrates a process of fixing the lid member 4 to the frame member 3 via the fixing member 9, which is the same as the first manufacturing method. Although not illustrated, fixation of the electronic device 1 or the arrangement of the connecting conductor 10 are the same as the first manufacturing method. In this example, although the process of fixing the electronic device 1 to the base body 2 is performed as illustrated in FIGS. 3A-1 and 3A-2 prior to the process illustrated in FIG. 5A, the fixation of the electronic device 1 to the base body 2 may be performed after the fixation of the frame member 3 as described before.

In the second manufacturing method as well, in the same manner as the frame member 600 provided with the coupling portions 306 as described in the first manufacturing method, the relative positional relationship of the high rigidity members is specified before the adhesion to the base body 2. Therefore, the high rigidity members may be fixed to the base body 2 with high degree of accuracy while maintaining the relative position of the plurality of high rigidity members. The number of the high rigidity members and the low rigidity member is not limited to two, and one or three or more each of the high rigidity members or the low rigidity members is also applicable. If there is only one each of the high rigidity member and the low rigidity member are provided in the frame member 3, it is a case where the one high rigidity member includes the first portion and the second portion, and the low rigidity member is positioned between the first portion and the second portion as described above. In this case, the lengths of the first portion and the second portion may be determined respectively half the length of one high rigidity member along the circumferential direction. Even though the number of the high rigidity members are plural, the number of the low rigidity members may be one. In other words, the plurality of low rigidity portions which are provided respectively between the plurality of the high rigidity members may be coupled. In this case, one low rigidity member may be configured to couple the plurality of low rigidity portions along an inner edge or an outer edge of the frame member 3 or an upper surface or a lower surface of the frame member 3. In this configuration, the metallic members as the plurality of high rigidity members may be formed easily by molding with a resin as the low rigidity member. For example, it is realized by constituting an inner edge or the entire circumference of the upper surface of the frame member 3 with the mold resin when molding the mold resin between the high rigidity members.

The electronic component 100 manufactured by the manufacturing method of the embodiment, the deformation of the frame member 3 may be restrained in the same manner as the electronic component 100 manufactured by the first manufacturing method, and the electronic component 100 with high degree of reliability may be provided.

The invention is not limited thereto, but a manufacturing method including arranging the frame-shaped high rigidity member on the base body 2, removing part of the high rigidity member, and arranging the low rigidity member at a portion where the high rigidity member is removed is also applicable. The low rigidity portions may also be formed by arranging the frame-shaped high rigidity member on the base body 2 and causing part of the high rigidity member to transform.

According to the technology disclosed in this disclosure, the electronic component with high degree of reliability is provided.

While the present invention has been described with reference to exemplary embodiments, it is to be understood that this disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2013-222522, filed Oct. 25, 2013 which is hereby incorporated by reference herein in its entirety.

What is claimed is:

1. An electronic component comprising:
  a base body having a first area and a second area in a periphery of the first area;
  an electronic device fixed to the first area of the base body;
  a lid member opposing the electronic device via a space; and
  a frame member configured to surround the space and fixed to the second area of the base body,
  wherein the frame member includes a first portion, a second portion, and a third portion located between the first portion and the second portion along a circumferential direction of the frame member,
  wherein the lengths of the first portion and the second portion in the circumferential direction are longer than the length of the third portion in the circumferential direction, coefficients of linear expansion of the first portion and the second portion are different from a coefficient of linear expansion of at least one of the base body and the lid member, and a Young's modulus of the third portion is lower than Young's moduli of the first portion and the second portion, and
  wherein the frame member includes an overlap portion which overlaps the base body, the frame member includes an expanded portion which does not overlap the base body, and the expanded portion is provided with a through hole.

2. The electronic component according to claim 1, wherein the Young's modulus of the third portion is lower than half the Young's moduli of the first portion and the second portion.

3. The electronic component according to claim 1, wherein the Young's modulus of the first portion is 60 gigapascals (GPa) or higher, and the Young's modulus of the third portion is 30 GPa or lower.

4. The electronic component according to claim 1 wherein in the circumference direction of the frame member, a sum of lengths of all the portions of the frame member having a Young's modulus equal to or lower than the Young's modulus of the third portion is half or smaller than a sum of lengths of all the portions of the frame member having a Young's modulus higher than the Young's modulus of the third portion.

5. The electronic component according to claim 1, wherein a material of the first portion and the second portion is metal, and a material of the third portion is resin.

6. The electronic component according to claim 1, wherein the first portion includes a first member, and the second portion includes a second member different from the first member.

7. The electronic component according to claim 6, wherein a material of the first member and the second member is stainless, and a material of the base body is ceramic.

8. The electronic component according to claim 1, wherein the frame member has a quadrilateral shape formed of a first side; a second side which is an opposed side of the first side, a third side, and a fourth side which is an opposed side of the third side,
wherein the frame member includes metallic first members located on the first side, the third side, and the second side, metallic second members located on the first side and the fourth side, and the second side, and
wherein the frame member includes resin members provided at a position between the first member and the second member on the first side and a position between the first member and the second member on the second side.

9. The electronic component according to claim 8, wherein the first side and the second side are longer than the third side and the fourth side.

10. The electronic component according to claim 1, wherein a length of the expanded portion of the frame member in a radial direction is longer than a length of the overlap portion of the frame member in the radial direction.

11. A system comprising:
the electronic component according to claim 1, in which the electronic device is an image pickup device or a display device; and
a housing configured to accommodate the electronic component.

12. The electronic component according to claim 1, wherein terminals are provided on a surface of the base body.

13. The electronic component according to claim 1, wherein the frame member and the base body are fixed to each other by a heat-cured resin, and the frame member and the lid member are fixed to each other by a light-cured resin.

14. An electronic component comprising:
a base body having a first area and a second area in a periphery of the first area;
an electronic device fixed to the first area of the base body;
a lid member opposing the electronic device via a space; and
a frame member configured to surround the space and fixed to the second area of the base body,
wherein the frame member includes a first portion, a second portion, and a third portion located between the first portion and the second portion along a circumferential direction of the frame member,
wherein the lengths of the first portion and the second portion in the circumferential direction are longer than the length of the third portion in the circumferential direction, a Young's modulus of the third portion is lower than Young's moduli of the first portion and the second portion, and
wherein coefficients of linear expansion of the first portion and the second portion are larger than the coefficient of linear expansion of the base body.

15. The electronic component according to claim 14, wherein the coefficients of linear expansion of the first portion and the second portion are larger than the coefficient of linear expansion of the lid member.

16. An electronic component comprising:
a base body having a first area and a second area in a periphery of the first area;
an electronic device fixed to the first area of the base body;
a lid member opposing the electronic device via a space; and
a frame member configured to surround the space and fixed to the second area of the base body,
wherein the frame member includes a first portion, a second portion, and a third portion located between the first portion and the second portion along a circumferential direction of the frame member,
wherein the lengths of the first portion and the second portion in the circumferential direction are longer than the length of the third portion in the circumferential direction, coefficients of linear expansion of the first portion and the second portion are different from a coefficient of linear expansion of at least one of the base body and the lid member, and a Young's modulus of the third portion is lower than Young's moduli of the first portion and the second portion,
wherein the frame member has a quadrilateral shape formed of a first side, a second sides which is an opposed side of the first side, a third side, and a fourth side opposing the third side,
wherein the frame member includes metallic first members located on the first side and the third side, metallic second members located on the first side and the fourth side, metallic third members located on the second side and the third side, and metallic fourth members located on the second side and the fourth side, and
wherein the frame member includes resin members located at a position between the first member and the second member on the first side, a position between the third member and the fourth member on the second side, a position between the first member and the fourth member on the third side, and a position between the second member and the fourth member located on the fourth side.

17. A package which has terminals, the package comprising:
a base body having a first area and a second area in a periphery of the first area; and
a frame member configured to surround a space and fixed to the second area of the base body,
wherein the frame member includes a first portion, a second portion, and a third portion located between the first portion and the second portion along a circumferential direction of the frame member, and
wherein a material of the first portion and the second portion is metal, a material of the third portion is resin, and a material of the base body is ceramic.

18. The package according to claim 17, wherein the frame member includes an overlap portion which overlaps the base body, the frame member includes an expanded portion which does not overlap the base body, and the expanded portion is provided with a through hole.

19. An electronic component comprising:
the package according to claim 18; and
an electronic device which is fixed to the first area,
wherein the terminals are provided on a surface of the base body, and the terminals are electrically connected to the electronic device.

20. A system comprising:
the electronic component according to claim 19; and
a housing configured to accommodate the electronic component,
wherein the electronic device is an image pickup device or a display device.

* * * * *